United States Patent
Avellan et al.

(10) Patent No.: US 9,024,175 B2
(45) Date of Patent: May 5, 2015

(54) METHOD FOR QUICKLY STABILIZING THE NOMINAL OUTPUT OF A THIN-FILM SOLAR MODULE

(75) Inventors: Alejandro Avellan, Munich (DE); Manfred Gruenerbel, Munich (DE)

(73) Assignee: Saint-Gobain Glass France (FR)

( * ) Notice: Subject to any disclaimer, the term of this patent is extended or adjusted under 35 U.S.C. 154(b) by 0 days.

(21) Appl. No.: 14/122,870

(22) PCT Filed: Jun. 26, 2012

(86) PCT No.: PCT/EP2012/062323
§ 371 (c)(1),
(2), (4) Date: Jan. 9, 2014

(87) PCT Pub. No.: WO2013/000894
PCT Pub. Date: Jan. 3, 2013

(65) Prior Publication Data
US 2014/0109949 A1    Apr. 24, 2014

(30) Foreign Application Priority Data
Jun. 28, 2011    (EP) .................................... 11171706

(51) Int. Cl.
*H01L 31/05* (2014.01)
*H01L 31/048* (2014.01)
*H01L 31/0749* (2012.01)
*H01L 31/18* (2006.01)
*H01L 25/00* (2006.01)

(52) U.S. Cl.
CPC .......... *H01L 31/0504* (2013.01); *H01L 31/048* (2013.01); *H01L 31/0749* (2013.01); *H01L 31/186* (2013.01); *Y02E 10/541* (2013.01); *H01L 25/50* (2013.01)

(58) Field of Classification Search
None
See application file for complete search history.

(56) References Cited

U.S. PATENT DOCUMENTS

| | | | | |
|---|---|---|---|---|
| 4,640,002 A * | 2/1987 | Phillips et al. | ................... | 438/12 |
| 6,093,757 A * | 7/2000 | Pern | ................................. | 524/99 |
| 6,548,819 B1 * | 4/2003 | Lovelady | .................... | 250/495.1 |
| 2002/0014886 A1 * | 2/2002 | Matsuyama | ..................... | 324/96 |
| 2003/0121542 A1 * | 7/2003 | Harneit et al. | ................. | 136/244 |
| 2009/0020157 A1 * | 1/2009 | Krasnov et al. | ................ | 136/256 |
| 2010/0073011 A1 * | 3/2010 | Svidenko et al. | ............. | 324/537 |

FOREIGN PATENT DOCUMENTS

| | | |
|---|---|---|
| EP | 2023400 | 2/2009 |
| WO | 2009133163 | 11/2009 |

OTHER PUBLICATIONS

Written Opinion mailed on Dec. 21, 2012 for application PCT/EP2012/062323 filed on Jun. 26, 2012 in the name of Saint-Gobain Glass France (German to English Translation).

(Continued)

*Primary Examiner* — Jennifer Michener
*Assistant Examiner* — Magali P Slawski
(74) *Attorney, Agent, or Firm* — Steinfl & Bruno LLP

(57) ABSTRACT

A method for improving a nominal output of a thin-film solar module with a laminated composite of two substrates which are connected to each other by at least one adhesive layer and between which there are solar cells connected in series is described. The method relates to solar cells being illuminated with an artificial light with an irradiance of at least 5 kW/m$^2$.

16 Claims, 4 Drawing Sheets

(56) References Cited

OTHER PUBLICATIONS

Figure 1:
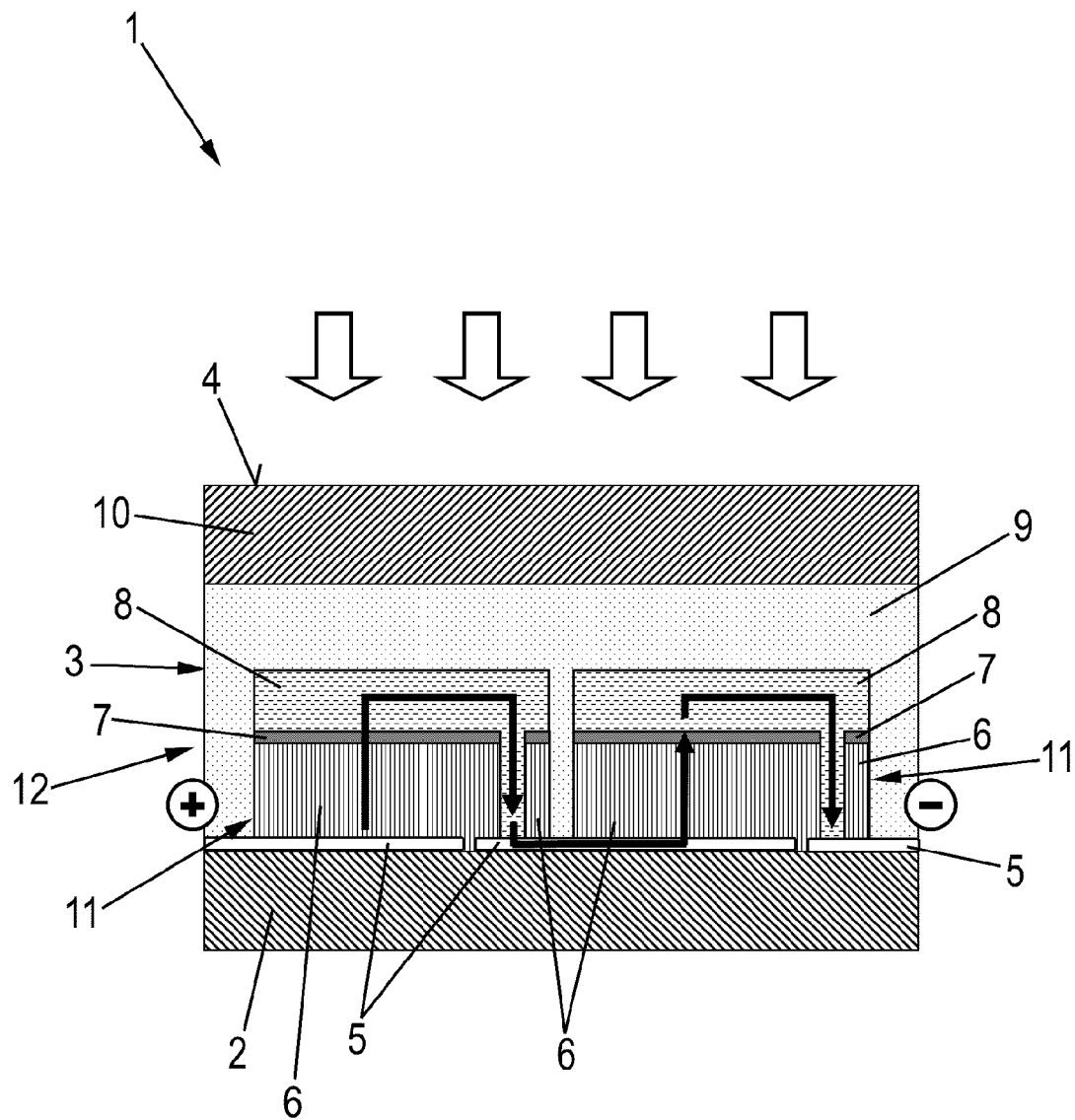

International Preliminary Report on Patentability mailed on Jan. 16, 2014 for PCT/EP2012/062323 filed on Jun. 26, 2012 in the name of Saint-Gobain Glass France.

J.A. del Cueto et al. "Striving for a Standard Protocol for Preconditioning or Stabilization of Polycrystalline Thin Film Photovoltaic Modules." Proceedings of SPIE, Jan. 1, 2009.

PCT International Search Report mailed on Dec. 21, 2012 for PCT Application PCT/EP2012/062323 filed on Jun. 26, 2012 in the name of Saint Gobain Glass France.

* cited by examiner

METHOD FOR QUICKLY STABILIZING THE NOMINAL OUTPUT OF A THIN-FILM SOLAR MODULE

CROSS REFERENCE TO RELATED APPLICATIONS

The present application is the U.S. national stage of International Patent Application PCT/EP2012/062323 filed on Jun. 26, 2012 which, in turn, claims priority to European Patent Application EP 11171706.2 filed on Jun. 28, 2011.

The invention is in the technical area of photovoltaic energy generation and relates to a method for quickly stabilizing the nominal output or the efficiency of a thin-film solar module.

Photovoltaic layer systems for the direct conversion of sunlight into electrical energy are sufficiently known. Large area layer systems are commonly referred to as "solar cells". The specific term "thin-film solar cells" refers to photovoltaic layer systems with thicknesses of only a few microns. Thin-film solar cells require carrier substrates for adequate mechanical stability. Known carrier substrates include inorganic glass, plastics (polymers), or metals, in particular metal alloys, and can, depending on the respective layer thickness and the specific material properties, be designed as rigid plates or flexible films. Due to the widely available carrier substrates and a simple monolithic integration, large-area arrangements of thin-film solar cells can be produced cost-effectively, with the semiconductor layer usually applied directly on the carrier substrate, for example, glass. With regard to the technological handling qualities and efficiency, thin-film solar cells with a semiconductor layer made of amorphous, micromorphous, or polycrystalline silicon, cadmium telluride (CdTe), gallium arsenide (GaAs), or a chalcopyrite compound, in particular copper indium/gallium sulfur/selenium $(Cl(In,Ga)(S,Se)_2)$, have proven advantageous, with, in particular, copper indium diselenide ($CuInSe_2$ or CIS) due to its band gap adapted to the spectrum of sunlight distinguished by a high absorption coefficient.

In order to obtain a technically useful output voltage, usually, many solar cells are connected serially, with the solar cells applied in particular on a carrier substrate usually bonded with a front transparent cover layer, in particular a covering panel, and at least one adhesion-promoting adhesive film into a weather resistant or solar module ("lamination"). For the material of the cover layer, low-iron soda lime glass is selected, for example. The adhesion-promoting adhesive film is made, for example, from ethylene vinyl acetate (EVA), polyvinyl butyral (PVB), polyethylene (PE), polyethylene acryl copolymer, or polyacrylamide (PA). EVA is distinguished, as a cross-linking elastic material, by particularly good proccessability and is, consequently, frequently used. In the case of thin-film solar modules with composite panel structure, PVB has been increasingly used in recent years. PVB is one of the thermoplastics that melt under the action of heat without cross-linking and without changing in chemical composition.

However, during the production of solar modules, various kinds of defects can occur, which disadvantageously cause internal electrical power losses and thus reduce the nominal output or efficiency of solar modules. Examples of this are short circuits (shunts), which result in a locally elevated recombination rate of charge carriers, mechanical defects, such as cracks, fractures, and delaminations or variations of material quality.

In some solar modules, particularly disadvantageously, an at least largely reversible (transient) reduction in nominal power can occur through the lamination process. Without being restricted to one theory, it is assumed that through the action of heat, pressure, and moisture at the time of lamination, defects are produced in the semiconductor layer which heal themselves over the course of time at least partially, but usually for the most part. As experiments have demonstrated, thin-film solar modules based on chalcopyrite semiconductors have, after lamination, a temporarily reduced nominal output that is ca. 5-20% lower than the nominal output of the solar cells before lamination.

For the manufacturer, this means, under certain circumstances, a financial disadvantage, as solar modules are sold at a price adjusted downward based on a supposedly lower output. If the nominal output for a solar module indicated by the factory is substantially lower than the actual nominal output that is established after recovery, this can possibly also result in a suboptimal designing of the electrical system of a solar plant.

In contrast, the object of the present invention consists in making available a method for quickly stabilizing the nominal output suitable for the series production of thin-film solar modules by means of which a (temporary) reduction in the nominal output of the thin-film solar module caused by the lamination process can already be eliminated, at least largely, in the factory in the context of the customary production cycles. This and other objects are accomplished according to the proposal of the invention by a method with the characteristics of the independent claim. Advantageous embodiments of the invention are indicated by the characteristics of the subclaims.

According to the invention, a method for quickly stabilizing the nominal output or efficiency of a thin-film solar module is presented.

The thin-film solar module comprises a laminated composite of two substrates connected to each other by at least one (plastic) adhesive layer, between which substrates (thin-film) solar cells connected in series are situated. Each solar cell includes at least one semiconductor layer forming a heterojunction or a pn-junction, in other words, a sequence of regions with a different conductor type. The laminated composite typically includes at least one (back) carrier substrate, for example, a glass carrier, on which the solar cells are applied, with, for this purpose, a first electrode layer, a second electrode layer, and at least one semiconductor layer disposed between the two electrode layers usually applied on the carrier substrate. Customarily, the semiconductor layer is doped with a dopant. Preferably, the semiconductor layer is made of a chalcopyrite compound, which can, in particular, be a I-III-VI-semiconductor from the group copper indium/gallium disulfide/diselenide ($Cu(InGa)(S/Se)_2$), for example, copper indium diselenide ($CuInSe_2$ or CIS), or related compounds. Typically, in the laminated composite, the carrier substrate with the solar cells applied thereto is glued by means of an adhesive layer to a (front) cover layer as transparent as possible to sunlight, for example, a glass plate, with the solar cells embedded in the adhesive layer.

The nominal output of the thin-film solar module can be determined in a manner known per se under the so-called standard test conditions (STC) of photovoltaics (Standard IEC 904-3). In application of the STC, with an irradiance of 1 $kW/m^2$ and a defined spectrum of sunlight perpendicular irradiation is carried out at a module temperature of 25° C. An irradiance of 1 $kW/m^2$ can, in particular, also be obtained with sunlight (especially in southern countries).

In the method according to the invention, the laminated composite or the connected solar cells of the thin-film solar module are illuminated with artificial light of at least one light source. The intensity of the light is selected such that the composite is illuminated with an irradiance of at least 5 kW/m² (kilowatts per square meter).

In the context of the present invention, the terms "irradiance" or "irradiation density" mean the output of the electromagnetic radiation striking the surface of the composite. As used here, the term "stabilization" refers to an increase or rise in the temporary (transiently) reduced nominal output (efficiency) of the laminated thin-film solar module through healing of defects in the semiconductor layer caused by the lamination process. As experiments of the applicant have demonstrated, a quick healing of the defects produced by the lamination process can be advantageously achieved by illumination of the solar cells with a very high irradiance of at least 5 kW/m². In fact, an appreciable stabilizing of the nominal output of the thin-film solar module can already be effected by illumination for a period of a few minutes, for example, in the single-digit minute range or shorter. The recovery of the transiently reduced nominal output of the thin-film solar module thus obtained is, surprisingly, not or at least not substantially worse than the recovery of the nominal output that is obtained, for example, by light aging for a period of 48 hours under standard test conditions (STC). According to the invention, such an effect can be obtained in a significantly shorter time.

As the applicant was able to demonstrate, the deciding factor for an increase in the transiently reduced nominal output is not the temporal duration of the illumination but rather the irradiance used. If one considers a constant product of irradiance and illumination time, it has been unexpectedly demonstrated that with a multiplied irradiance and a correspondingly shortened illumination time, a better effect can be obtained. However, a saturation of the effect does occur with increasing irradiance. In particular, with thin-film solar modules with solar cells based on a chalcopyrite compound, as of an irradiance of ca. 5 kW/m², a saturation relative to a further increase of the nominal output can be observed. It can prove beneficial for the laminated composite to be illuminated with an irradiance of a maximum of 15 kW/m², with, as already mentioned, a saturation of the rise in the nominal output occurring already as of ca. 5 kW/m².

Through the capability of obtaining an increase in the transiently reduced nominal output of the thin-film solar module by illuminating solar cells with an irradiance of at least 5 kW/m² for a relatively short period of time of, for example, a few minutes or shorter, the method according to the invention thus even enables, for the first time, stabilizing the nominal output in series production of thin-film solar modules, wherein cycle times in the single-digit minute range per solar module are customary. Thus, thin-film solar modules can be subjected to recovery already in the factory and can be specified with a higher nominal output such that the thin-film solar modules have better quality. In addition, the electrical system of solar plants can be better and more precisely tuned.

In the context of the present invention, the time data for the irradiation of the thin-film solar module refer in each case to a time period during which (with full-surface irradiation) the thin-film solar module is irradiated over its entire surface or during which (with section by section irradiation) one section or part of the thin-film solar module is irradiated section by section (i.e., locally). Even with section by section irradiation, the thin-film solar module is irradiated over its entire surface, with different sections of the solar module being irradiated at different times, for example, by moving the light source and the thin-film solar module relative to each other such that an, in particular, linear light beam sweeps over the thin-film solar module and, in each case, irradiates sections of the thin-film solar module.

For recovery of the solar cells adequate in practice, i.e., in order to obtain the desired effect of a significant stabilizing of the nominal output, it can be advantageous, depending on the type of thin-film solar module and the irradiance of the artificial light used, for the laminated composite or at least one section of the laminated composite to be illuminated for an illumination period of a maximum of 10 min (minutes), a maximum of 4 min, a maximum of 2 min, a maximum of 1 min, or a maximum of 30 s (seconds). In the context of the above statements, these data are based on a full-surface irradiation of thin-film solar module (all solar cells are irradiated) for the entire irradiation period of the thin-film solar module or, alternatively, in the case of a section by section irradiation of the thin-film solar module (only a portion of the solar cells is irradiated in each case or not all solar cells are irradiated at the same time) on the period in which a respective section of the thin-film solar module is locally irradiated.

In any case, a satisfactory increase of the transiently reduced nominal output of thin-film solar modules can be obtained by illumination within a few minutes, in contrast to natural recovery by sunlight, which requires illumination of ca. 48 h at an irradiance of 1 kW/m² in order to reach such an effect. Incidentally, it should be mentioned that at least in northern Europe, an irradiance of 1 kW/m² by sunlight is very seldom obtained. In particular, in the case of thin-film solar modules with thin-film solar cells with a semiconductor layer based on a chalcopyrite compound, as from an illumination period of ca. 2 min, saturation with regard to a further increase in the nominal output occurs such that it can be advantageous to limit illumination of such modules to an illumination period of 2 min.

In the production of thin-film solar modules, an illumination according to the invention can, for example, take place immediately following lamination, but also at a later time, but still before entry of the thin-film solar module into service.

In a particularly advantageous embodiment of the method according to the invention, the laminated composite or the solar cells are illuminated section by section (locally), in particular linearly. In a technically simple implementation, the laminated composite and the light source are translatorily moved relative to each other for this purpose, with, in particular, the laminated composite moved past a stationary light source. The, in particular, linear, light beam sweeps over the surface of the thin-film solar module and irradiates in each case local sections of the thin-film solar module with an irradiance of at least 5 kW/m². The line width (dimension perpendicular to its length) of a linear light beam is, for example, in the range from 1 to 10 cm. Advantageously, with these line widths, a displacement speed of the light beam on the surface of the thin-film solar module (i.e., speed of travel of the thin-film solar module relative to the light source) is in the range from 0.001 cm/sec to 10 cm/sec, in order to obtain the desired effect, through local irradiation of the thin-film solar module with an irradiance of at least 5 kW/m² and sweeping of the complete surface of the thin-film solar module. The speed of travel is not independent of the line width. In particular, the correlation that a larger line width enables a more rapid speed of travel and vice versa applies. By means of the linear configuration of the light beam for the irradiation of the thin-film solar module, an increase in the nominal output of the thin-film solar module can be effected, while, at the same time, advantageously, the energy consumption of the light source can be reduced to a fraction of that of a full-surface illumination. In addition, the apparatus for illumination of the thin-film solar module is greatly simplified. Moreover, in a particularly advantageous manner, active cooling of the thin-film solar module during the illumination can be dispensed with, as with a full-surface illumination of the thin-film solar module, it is sometimes necessary to deal with excessive heating of the complete thin-film solar module, which could result in impairment or even damage of the thin-film solar module. On the other hand, through the section by section illumination of the thin-film solar module, an absolutely desirable local heating of the thin-film solar module can be obtained, which advantageously contributes to a further improvement of the nominal output.

In another advantageous embodiment of the method according to the invention, a forward and/or reverse biased electric voltage is applied to the connected solar cells during illumination, by means of which the transiently reduced nominal output can be increased or stabilized even more.

In general, the light source for illumination of the thin-film solar module can be implemented such that the light is transmitted with a freely selectable spectrum. Advantageously, the spectrum of the light source corresponds at least approx. to the spectrum or to at least to a part of the spectrum of sunlight (or approaches it), by means of which a particularly effective increase in the transiently reduced nominal output of the thin-film solar module can be obtained.

In another advantageous embodiment of the method according to the invention, a laminated composite with a laminated pane structure with thin-film solar cells connected in series is illuminated, with the thin-film solar cells having, in particular, a semiconductor layer made of a chalcopyrite compound, in particular $Cu(In/Ga)(S/Se)_2$.

The invention further extends to a method for production of a thin-film solar module with a laminated composite of two substrates connected to each other by at least one adhesive layer, between which substrates solar cells connected in series are situated, which comprises the following steps:
  providing the laminated composite;
  stabilizing the nominal output of the thin-film solar module by a method as described above in which the solar cells are illuminated with artificial light with an irradiance of at least 5 kW/m2.

Such a method for production of a solar module can include other characteristics of the above-described method for increasing the transiently reduced nominal output of a thin-film solar module.

Furthermore, the invention extends to the use of artificial light for illumination of the solar cells of a laminated composite to increase the transiently reduced nominal output of a thin-film solar module made from the laminated composite, in which the thin-film solar cells can have, in particular, a semiconductor layer that is made from a chalcopyrite compound, in particular $Cu(In/Ga)(S/Se)_2$, with the solar cells being illuminated with light of an irradiance of at least 5 $kW/m^2$.

BRIEF DISCUSSION OF THE DRAWINGS

Figure 2:
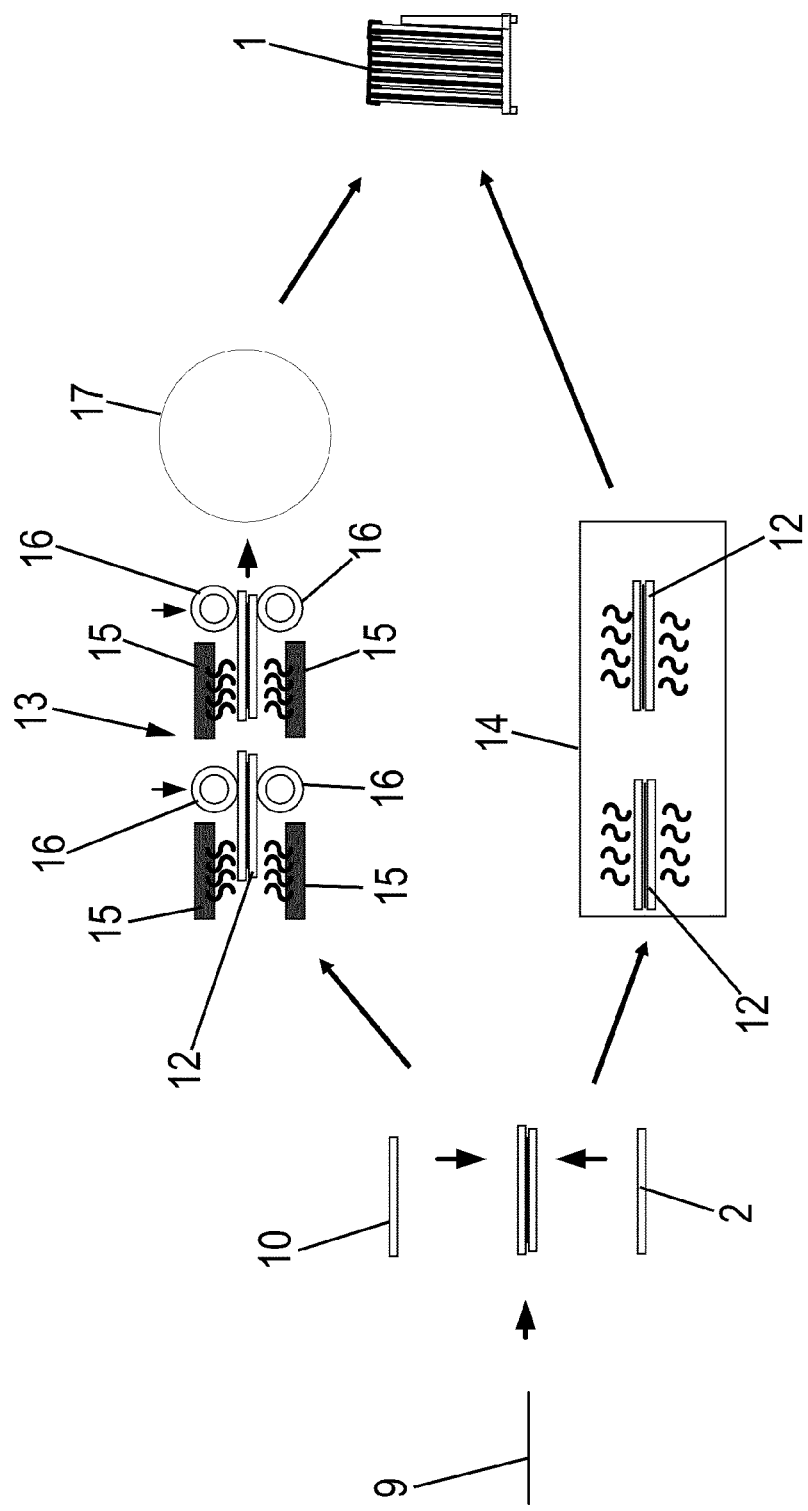
Figure 3:
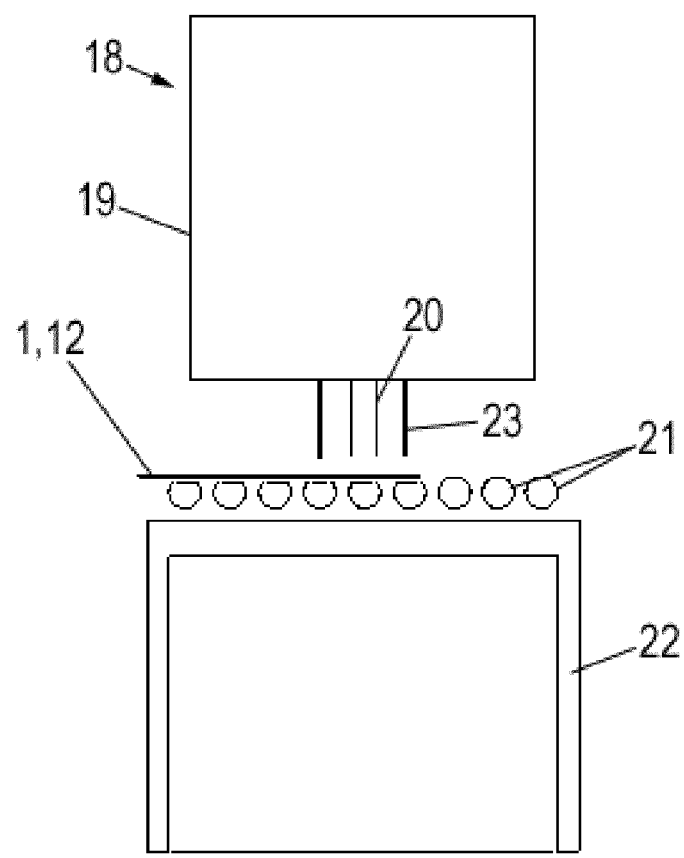
Figure 4A:
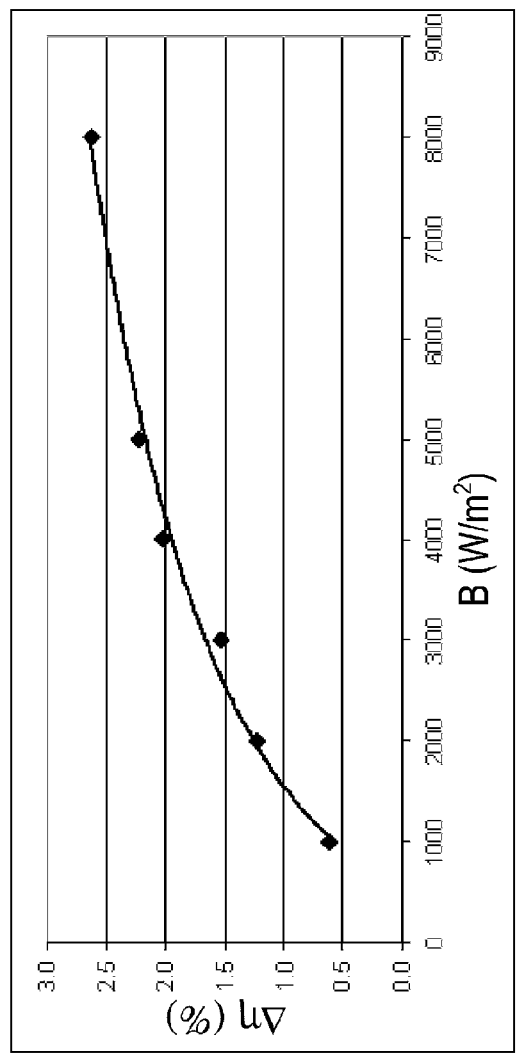
Figure 4B:
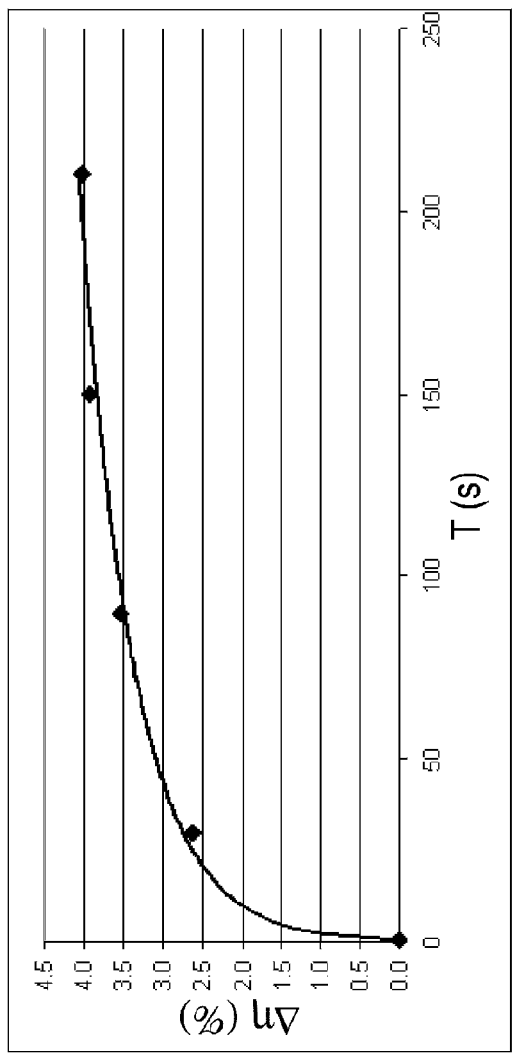

The invention is now explained in detail using exemplary embodiments, with reference being made to the accompanying figures. They depict in simplified, not-to-scale representation:

FIG. 1 a schematic representation of an exemplary thin-film solar module;
FIG. 2 a schematic representation to illustrate the lamination process of the thin-film solar module of FIG. 1;
FIG. 3 a schematic representation of an illumination device for illumination of the thin-film solar module of FIG. 1;
FIG. 4A-4B a diagram to illustrate the recovery effect with various light intensities (FIG. 4A), and as a function of time with unchanged light intensity (FIG. 4B).

DETAILED DESCRIPTION OF THE DRAWINGS

FIG. 1 illustrates a thin-film solar module referenced as a whole with the reference character 1. The thin-film solar module 1 comprises a plurality of serially connected solar cells 11 in integrated form, with, for the purpose of a simpler presentation, only two thin-film solar cell 11 depicted in FIG. 1. Of course, a large number (for example, ca. 100) of thin-film solar cells are serially connected in the thin-film solar module 11. The thin-film solar module 1 has a composite panel structure, i.e., it has an electrically insulating first substrate 2 with a layer structure 3 of thin layers applied thereon, with the layer structure 3 disposed on a light-entry-side surface of the first substrate 2. The first substrate 2 is implemented here, for example, as a rigid glass plate with a relatively low light transparency, with the equal possibility of using other electrically insulating materials with a desired strength and inert behavior relative to the process steps performed.

The layer structure 3 comprises a rear electrode layer 5 disposed on the light-entry-side surface of the first substrate 2, which layer is made, for example, of an opaque metal such as molybdenum (Mo) and can be applied by vapor deposition or magnetic field-assisted cathode sputtering on the first substrate 2. The rear electrode layer 5 has a layer thickness of 300 nm to 600 nm, which is here, for example, 500 nm.

On the rear electrode layer 5, a photovoltaically active semiconductor layer or absorber layer 6 that is made from a semiconductor doped with metal ions whose band gap is preferably capable of absorbing the largest possible share of sunlight is deposited, for example, by sputtering. The absorber layer 6 is made, for example, of a p-conducting chalcopyrite semiconductor, for example, a compound of the group $Cu(In/Ga)(S/Se)_2$, in particular sodium (Na)-doped $Cu(In/Ga)(S/Se)_2$. The absorber layer 6 has a layer thickness that is in the range, for example, from 1 to 5 µm, and in particular, is ca. 2 µm. Between the rear electrode layer 5 and the absorber layer 6, a barrier layer of, for example, silicon nitride that acts as a diffusion barrier for the metal ions of the absorber layer serving as the dopant can be provided, which is not depicted in detail in FIG. 1. A conversion of the various metals into the semiconductor material takes place by means of heating in a furnace (RTP=rapid thermal processing).

A buffer layer 7, made here, for example, of a single layer of cadmium sulfide (CdS) and a single layer of intrinsic zinc oxide (i-ZnO), is deposited on the absorber layer 6, which is not depicted in detail in FIG. 1.

A front electrode layer 8 is applied on the buffer layer 7, for example, by sputtering. The front electrode layer 8 is transparent to irradiation in the visual spectral range ("window electrode") such that the incident sunlight (illustrated in FIG. 1 by the four parallel arrows) is only slightly weakened. The front electrode layer 8 is based, for example, on a doped metal oxide, for example, n-conducting aluminum (Al)-doped zinc oxide (ZnO). Such a front electrode layer 8 is generally referred to as a TCO-layer (TCO=transparent conductive oxide). The layer thickness of the front electrode layer 8 is, for example, ca. 500 nm.

By the front electrode layer 8, together with the buffer layer 7 and the absorber layer 6, a heterojunction (i.e., a sequence of layers of the opposing conductor type) is formed. The buffer layer 7 can effect an electronic adaptation between the semiconductor material of the absorber layer 6 and the material of the front electrode layer 8.

The various layers of the layer structure 3 on the first substrate 2 are structured using a suitable structuring technology such as laser writing, yielding the integrated serially connected thin-film solar cells 11. For each solar cell, such structuring typically comprises three structuring steps (P1, P2, P3), wherein, first, the rear electrode layer 5 (P1), then, the semiconductor layer 6 (P2), and, finally, the front electrode layer 8 and the semiconductor layer 6 (P3) are structured. Such structuring is known per se to the person skilled in the art such that it need not be discussed in detail here.

In the example depicted here, both the resultant positive voltage connection (+) and the resultant negative voltage connection (−) of the thin-film solar module 1 are guided over the rear electrode layer 5 and electrically contacted there. Through illumination of the thin-film solar cells 11, an electric voltage is generated on the two voltage connections. A resultant current path is illustrated in FIG. 1 by the serial arrows.

For protection against environmental influences, a (plastic) adhesive layer 9 that serves to encapsulate the layer structure 3 is applied on the front electrode layer 8. In addition, the layer structure 3 includes as a front-side cover layer a second substrate 10 transparent to sunlight that is implemented, for example, in the form of a glass plate made of low-iron extra-white glass, with the equal possibility of using other electrically insulating materials with desired strength and inert behavior relative to the process steps performed. The second substrate 10 serves for sealing and mechanical protection of the layer structure 3. The thin-film solar module can be illuminated via a front-side surface 4 of the second substrate 10 to generate electrical energy.

The two substrates 2, 10 are fixedly bonded to each other ("laminated") by the adhesive layer 9, with the adhesive layer 9 implemented here, for example, as a thermoplastic adhesive layer that is plastically deformable by means of heating and which, upon cooling, bonds the two substrates 2 and 10 fixedly to each other. The adhesive layer 9 is made here, for example, of PVB. The two substrates 2, 10 form together a laminate composite 12 with the thin-film solar cells 11 embedded in the adhesive layer 9. The size of the rectangular front-side surface 4 of the thin-film solar module 1 is here, for example, $1.6 \times 0.7 \text{ m}^2$.

In the production of the thin-film solar module 1, lamination occurs during which the two substrates 2, 10 are adhered by the adhesive layer 9, with the thin-film solar cells 11 disposed therebetween. Customarily, in series production, for this, two different lamination processes are used, which are illustrated in detail in FIG. 2.

In the two lamination processes, the first substrate 2 with the structured thin-film solar cells 11 applied thereon and the second substrate 10 and a film serving as adhesive layer 9 are disposed lying one over another. Then, this layer structure is introduced into a roll laminator 13, with heating by means of heating elements 15 and pressure exerted by rollers 16, such that the PVB film melts and the laminated composite 12 is created after cooling. This is followed by treatment in an autoclave 17. Alternatively, the layer structure can be introduced into a vacuum laminator 14, wherein heating likewise occurs by means of heating elements and pressure is exerted by a membrane (not shown), by means of which the PVB film melts and the laminated composite 12 is created. By means of the lamination process, reversible (healable) defects can occur in the solar cells 11, which temporarily reduce the nominal output of the thin-film solar module 1.

In order to obtain, in the context of the series production of thin-film solar module 1, a quick and efficient recovery of efficiency, i.e., a healing of the defects in the semiconductor layer of the thin-film solar cells 11 caused by lamination, the laminated composite 12 or the thin-film solar module 1 is subjected to illumination with artificial light in a special illumination device 18. In the following, reference is made to the illumination of the thin-film solar module 1, with the understanding that it is also equally possible to illuminate the laminated composite 12, which can also be an intermediate product in the production of the thin-film solar module 1 (which, for example, does not yet have any voltage connections).

The illumination device 18 includes at least one artificial light source 19, for example, a halogen lamp, preferably with a spectrum approximating the spectrum of sunlight, which generates a light beam 20 for the illumination of the thin-film solar cells 11. By means of a shading device or aperture 23, a strip-shaped or linear light beam 20 extending over one full dimension (width or length) of the rectangular, front-side surface 4 of the second substrate 10 is generated. Here, the light beam 20 has, on the surface 4 of the second substrate 10, for example, a width of ca. 1.5 cm, with the light beam 20 striking the surface 4 of the second substrate 10 at least approx. at a right angle. As indicated in the introduction to the description, the line width can be, for example, generally speaking, in the range from 1 to 10 cm.

The thin-film solar module 1 is guided past below the stationary light source 19 translatorily (unidirectionally) by driven cylinders 11 on a frame 22, with the stationary linear light beam 20 sweeping over the surface 4 of the second substrate 10 and the thin-film solar module 1 illuminated section by section. The width of the light beam 20 is measured in the direction of movement of the thin-film solar module 1. As already mentioned, the light beam 1 runs perpendicular to the direction of movement completely over one dimension parallel to the edges of the thin-film solar module 1, in this case, for example, over its width. The thin-film solar module 1 is moved relative to the light beam 20, such that the thin-film solar module 1 or the thin-film solar cells 11 are illuminated with an irradiance of at least $5 \text{ kW/m}^2$. The light source 19 has a high light intensity such that the distance between the light source 17 and the thin-film solar module 1 is appropriately adjusted. The speed of travel of the thin-film solar module 1 relative to the light source 19 is, for example, in the range from 0.001 cm/sec to 10 cm/sec, with the speed of travel generally dependent on the line width of the light beam.

The following Table 1 reports the reduction of the efficiency (nominal output) of a variously processed thin-film solar module 1 with a semiconductor layer based on a chalcopyrite compound.

TABLE 1

|  |  | $\Delta\eta$ (%) |
| --- | --- | --- |
| #1 | After lamination | −11.8 |
| #2 | Linear illumination 8 kW/m², 10 min | −2.4 |
| #3 | Linear illumination 5 kW/m², 10 min | −2.2 |
| #4 | Light aging 1 kW/m², 48 h | −0.6 |

In Table 1, $\Delta\eta$ (%) refers to the percentage difference in efficiency of the thin-film solar module, based on the efficiency of the connected solar cells before lamination.

1 pertains to a measurement of the efficiency in a thin-film solar module immediately after lamination (unencapsulated), whereby the thin-film solar module was exposed to neither heat treatment nor special illumination with artificial light.

According to it, a percentage reduction in efficiency of −11.8% occurs due to lamination such that the nominal output of such a thin-film solar module from the factory is less than the actual nominal output that is established over time through healing of the defects. #2 pertains to measurement of the efficiency in a thin-film solar module after lamination, where an illumination was performed with a linear light beam as in illumination device 18 with an irradiance of 8 kW/m² for period of 10 min. According to it, a clear recovery of efficiency is obtained through the illumination, with the percentage reduction of the efficiency after illumination still only −2.6%. #3 pertains to a measurement of the efficiency with a thin-film solar module processed as in #2, but with an irradiance of 5 kW/m². In this case as well, a clear recovery of the efficiency is obtained, with the percentage reduction of the efficiency after the illumination amounting to −2.4% and thus falling in the same order of magnitude as with #2. And finally, #4 pertains to a measurement of the efficiency with a thin-film solar module after lamination, where so-called light aging (light soaking) was carried out with full-surface illumination with an irradiance of 1 kW/m² for period of 48 hours. According to it as well, by means of light aging, a recovery of efficiency is obtained, with the percentage reduction of the efficiency after light aging amounting to −0.6%. In series production with cycle times in the single-digit minute range, such light aging cannot be carried out due to the long irradiation time.

Thus, it can be seen that by means of the illumination of the thin-film solar module according to the invention with a linear light beam at 5 kW/m² or 8 kW/m² for a comparatively short illumination period of 10 min, a clear recovery of the transiently reduced efficiency can be obtained which does not differ substantially from the efficiency after light aging for 48 hours.

The following Table 2 reports the results for another thin-film solar module with a semiconductor layer based on a chalcopyrite compound (CIS).

TABLE 2

|  |  | Δη (%) |
|---|---|---|
| #1 | After lamination | −16.3 |
| #3 | Linear illumination 10 kW/m², 1 min | −5.6 |
| #5 | Light aging 1 kW/m², 48 h | −4.0 |

In Table 2, Δη (%) again refers to the percentage difference in efficiency of the thin-film solar module, based on the efficiency of the connected solar cells before lamination. #1 pertains to a measurement of the efficiency immediately after lamination (unencapsulated) without the treatment or special illumination with artificial light. For this thin-film solar module, a percentage reduction in efficiency of −16.3% occurs. #2 pertains to a measurement of the efficiency with a thin-film solar module after lamination, where an illumination was performed with a linear light beam with an irradiance of 10 kW/m² for a period of 1 min. According to it, a clear recovery of efficiency is obtained through the illumination, with the percentage reduction of the efficiency after illumination still only −5.6%. #3 pertains to a measurement of the efficiency with the thin-film solar module after lamination, where light aging was carried out with a full-surface illumination with an irradiance of 1 kW/m² for a period of 48 hours, with the percentage reduction of the efficiency after the light aging amounting to −4.0%.

As shown by the data of Table 2, a reduction in output loss (i.e., increase of nominal output) of 10.7% can be obtained through illumination with higher light intensity, with, in comparison, only a slight further increase of 1.6% can be obtained through light aging. The output loss produced by lamination can thus be significantly reduced. It is also clear that the time saved compared to the 48-hour light aging corresponds to a factor of 2880, although the irradiance was increased only by a factor of 10, and the energy used was less by a factor of ca. 20, as the following calculation example shows.

With the use of halogen lamps, with a rectangular thin-film solar module with a size of 1.6×0.7 m² (length×width), a full-surface illumination with an irradiance of 1 kW/m² requires a connected electrical load of, for example, ca. 40.5 kW. If a full-surface illumination was provided at 10 kW/m², the connected electrical load increased typically by a factor of 5 to 10, thus would be ca. 202.5 to 405 kW, which is associated, in practice, with significant costs. On the other hand, the connected electrical load with a linear illumination of the thin-film solar module with a width of 0.7 m and an irradiance of 10 kW/m² is ca. 2.1 kW. Thus, the energy savings through the linear illumination is a factor of ca. 20 compared to a full-surface illumination at 1 kW/m² and a factor of ca. 100 to 200 compared to a full-surface illumination at 10 kW/m².

Thus, through the linear illumination of the thin-film solar module, energy can be saved to a significant extent, in particular since a full-surface illumination would normally require active cooling of the thin-film solar module.

FIG. 4A shows a diagram to illustrate the recovery effect with different light intensities or irradiances B (W/m²). A thin-film solar module with a semiconductor layer based on a chalcopyrite compound was illuminated for period of 30 s with a linear light beam, with the thin-film solar module moved relative to the light beam. The amount of the percentage difference in the efficiency of the thin-film solar module is indicated, based on the efficiency of the connected cells before lamination, Δη (%), for various irradiances. Clearly, the percentage change rises sharply at first, until at ca. 5 kW/m², saturation occurs.

FIG. 4B shows a diagram to illustrate the recovery effect with various illumination times T(s). A thin-film solar module with a semiconductor layer based on a chalcopyrite compound was illuminated with a linear light beam and an irradiance of 8 kW/m², with the thin-film solar module moved relative to the light beam. The amount of the percentage difference in the efficiency of the thin-film solar module, based on the efficiency of the connected solar cells before lamination, Δη (%), is reported for various durations of illumination. Clearly, already after a short time, a large increase is obtained, which flattens rather logarithmically thereafter. At ca. 2 min duration of illumination, saturation occurs.

The present invention makes available a method for stabilizing the nominal output of a thin-film solar module that can be used in industrial series production of thin-film solar modules with cycle times in the single-digit minute range for at least substantial healing of defects produced by lamination.

LIST OF REFERENCE CHARACTERS

1 thin-film solar module
2 first substrate
3 layer structure
4 surface
5 rear electrode layer
6 semiconductor layer
7 buffer layer
8 front electrode layer
9 adhesive layer
10 second substrate 11 thin-film solar cell
12 composite
13 roll laminator
14 vacuum laminator
15 heating element
16 roller
17 autoclave
18 illumination device
19 light source
20 light beam
21 cylinder
22 frame
23 aperture

The invention claimed is:

1. A method for stabilizing a nominal output of a thin-film solar module with a laminated composite of two substrates connected to each other by at least one adhesive layer, between which substrates chalcopyrite solar cells connected in series are situated, comprising:
moving the laminated composite and an artificial light source translatorily relative to each other; and
illuminating the laminated composite linearly with the artificial light source with an irradiance of at least 5 kW/m$^2$ for an illumination period of a maximum of 10 minutes with a linear light beam having a line width in the range from 1 to 10 cm, wherein a displacement speed of the light beam on a surface of the thin-film solar module is in the range from 0.001 cm/sec to 10 cm/sec.

2. The method according to claim 1, wherein the laminated composite is illuminated with an irradiance of a maximum of 15 kW/m$^2$.

3. The method according to claim 1, wherein the laminated composite is moved past a stationary light source.

4. The method according to claim 1, wherein, during the illumination, a forward and/or reverse biased electric voltage is applied to the connected solar cells.

5. The method according to claim 1, wherein a spectrum of the artificial light corresponds to at least one part of a spectrum of sunlight.

6. The method according to claim 1, wherein the laminated composite has a laminated pane structure with thin-film solar cells connected in series, the thin-film solar cells having a semiconductor layer made of a chalcopyrite compound.

7. A method for producing a thin-film solar module, comprising:
connecting two substrates to each other by at least one adhesive layer to form a laminated composite;
connecting solar cells in series and between the two substrates so as to form a thin-film solar module; and
stabilizing a nominal output of the thin-film solar module by the method according to claim 1.

8. A method, comprising:
using artificial light source for linear illumination of chalcopyrite solar cells of a laminated composite of a thin-film solar module for stabilization of the nominal output of the thin-film solar module, wherein the solar cells are illuminated with light from the artificial light source with an irradiance of at least 5 kW/m$^2$ for an illumination period of a maximum of 10 minutes with a linear light beam having a line width in the range from 1 to 10 cm, wherein a displacement speed of the light beam on a surface of the thin-film solar module is in the range from 0.001 cm/sec to 10 cm/sec; and wherein using the artificial light source includes moving the laminated composite and the artificial light source translatorily relative to each other.

9. The method according to claim 1, wherein a spectrum of the artificial light does not correspond to at least one part of a spectrum of sunlight.

10. The method according to claim 6, wherein the chalcopyrite compound is Cu(In/Ga)(S/Se)$_2$.

11. The method according to claim 1, further including specifying the nominal output of the thin-film solar module after illumination.

12. The method according to claim 7, further including specifying the nominal output of the thin-film solar module after illumination.

13. The method according to claim 8, further including specifying the nominal output of the thin-film solar module after illumination.

14. The method according to claim 1, wherein illuminating the laminated composite includes irradiating at least two sections of an entire surface of the thin-film solar module.

15. The method according to claim 14, wherein irradiating the at least two sections includes irradiating section by section so as to irradiate the entire surface of the thin-film solar module.

16. The method according to claim 15, wherein irradiating section by section includes irradiating different sections of the surface of the thin-film solar module at different times.

* * * * *